United States Patent [19]

Breitling

[11] 4,241,317
[45] Dec. 23, 1980

[54] FREQUENCY GENERATOR SUITABLE FOR USE AS POSITION-FREQUENCY TRANSDUCER

[75] Inventor: Wolfram Breitling, Schwieberdingen, Fed. Rep. of Germany

[73] Assignee: Robert Bosch GmbH, Stuttgart, Fed. Rep. of Germany

[21] Appl. No.: 12,801

[22] Filed: Feb. 16, 1979

[30] Foreign Application Priority Data

Mar. 10, 1978 [DE] Fed. Rep. of Germany ....... 2810347

[51] Int. Cl.³ .......................................... H03K 3/023
[52] U.S. Cl. .................................... 331/65; 331/151; 331/167; 331/181
[58] Field of Search ................... 331/65, 108 D, 111, 331/143, 151, 117 R, 167, 181

[56] References Cited
U.S. PATENT DOCUMENTS

| | | | |
|---|---|---|---|
| 3,732,443 | 5/1973 | Lovrenich | 331/65 X |
| 3,973,191 | 8/1976 | Zabler | 324/207 |

*Primary Examiner*—Siegfried H. Grimm
*Attorney, Agent, or Firm*—Frishauf, Holtz, Goodman & Woodward

[57] ABSTRACT

The resistance-inductance element used to determine the frequency of the frequency generator in the prior art circuits is replaced by an inductance-capacitance combination. As in the prior art circuits the frequency determining circuit is connected between the output and the inverting input of an operational amplifier to whose direct input a reference voltage is applied. However in the present circuit an inductance is connected from the output to the inverting input of the operational amplifier and a capacitance-resistance circuit is connected in parallel with the inductance. A capacitance connects the inverting input of the operational amplifier to ground potential. Resistors connected from the inverting input to the positive voltage supply and to the output terminal from the inverting input and from the direct input are used to change the slope of the curve of frequency vs. inductance.

9 Claims, 1 Drawing Figure

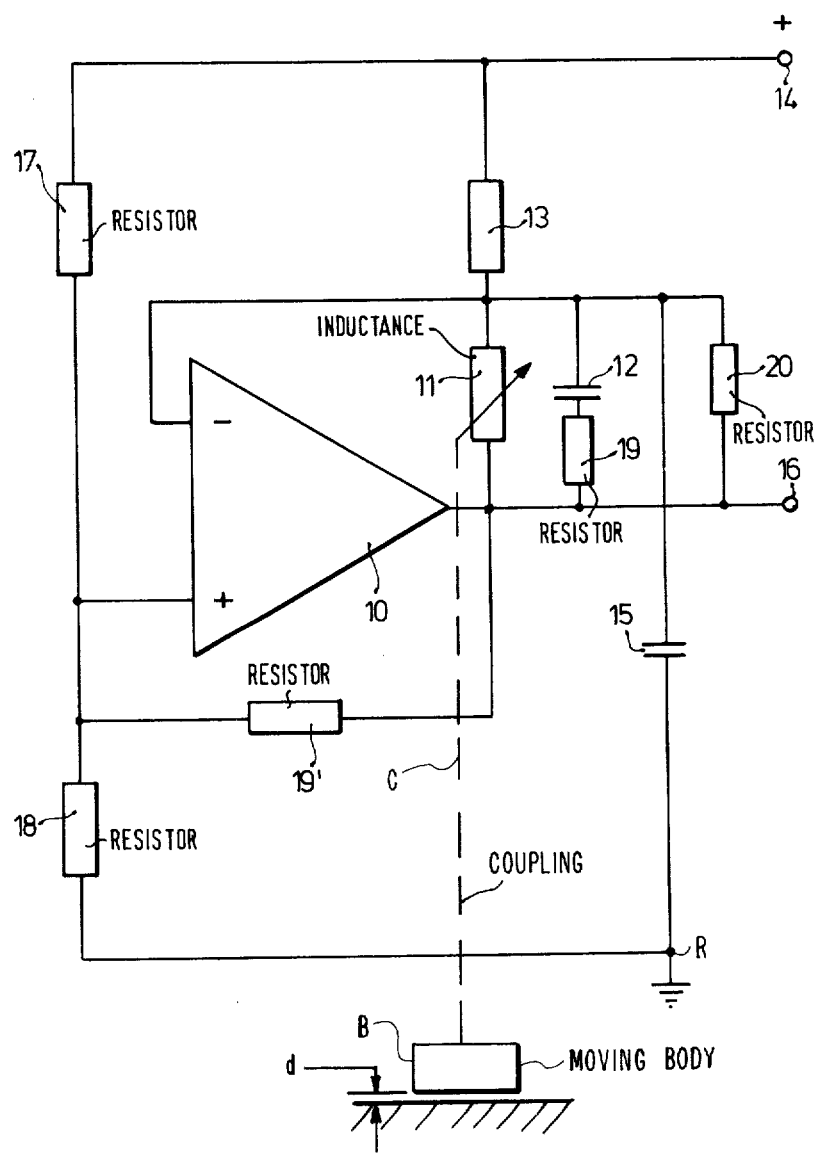

FREQUENCY GENERATOR SUITABLE FOR USE AS POSITION-FREQUENCY TRANSDUCER

CROSS REFERENCE TO RELATED APPLICATIONS AND PUBLICATIONS

The present invention is an improvement of the frequency generator disclosed in DE-OS 2,416,237, to which U.S. Pat. No. 3,973,191, Zabler, assigned to the assignee of this application, in part corresponds.

The present invention relates to frequency generators and, more particularly, to frequency generators suitable as position-frequency transducers.

BACKGROUND AND PRIOR ART

A position-frequency transducer is described in U.S. Pat. No. 3,973,191, Zabler. In the frequency generator disclosed therein, the frequency determining circuit is an inductor-resistor circuit. It has been found that line capacitances, varying losses due to changes in current drawn, as well as changes in the supply voltage tend to cause errors in output frequency.

THE INVENTION

It is an object of the present invention to furnish a frequency generator which draws an approximately constant current thereby decreasing errors resulting from changes in the current drawn from the supply and decreasing the requirements or entirely eliminating a voltage stabilization circuit supplied for the frequency generator of the prior art. It is a further object of the present invention to eliminate the reactive current component and to decrease the effect of line capacitances. It is a further object of the present invention to eliminate changes in output frequency caused by the effect of temperature variations on the resistor of the prior art frequency generator, to decrease the required inductance and to decrease the current consumption while increasing the accuracy.

In accordance with the present invention, an inductance, the value of which preferably is variable in accordance with movement of an object, is connected to a second input and the output of the comparator means which also form part of the prior art circuit; a reference voltage is applied to the first input of the comparator means. A second capacitor connects the parallel circuit formed by a first capacitor and the inductance to ground potential.

In a particularly preferred embodiment, the inductance is mechanically coupled to a movable object in such a manner that the inductance value is proportional to the distance of the object from a predetermined starting position.

DRAWING ILLUSTRATING A PREFERRED EMBODIMENT

The single FIGURE is a schematic diagram of the circuit of the present invention.

The comparator is shown as an operational amplifier 10. Operational amplifier 10 has an output 16, a direct input and an inverting input. The output is connected to the inverting input by means of the parallel combination of an inductance 11, and a capacitor 12 connected in series with a resistor 19. The inverting input of operational amplifier 10 is connected through a resistor 13 to a terminal 14 receiving a positive supply voltage, the negative, or ground being as reference bus R. A second capacitor 15 connects the inverting input of operational amplifier 10 to ground potential, i.e. bus R. The output frequency is supplied at terminal 16. A voltage divider including resistors 17 and 18 is connected between terminal 14 and ground potential. The common point of resistors 17 and 18 is connected to the direct input of operational amplifier 10. It is further connected through a resistor 19' to terminal 16. A further resistor 20 is connected in parallel to inductance 11 and hence to the R/C circuit 19, 12.

OPERATION

If the voltage at the output of operational amplifier 10 has a predetermined value, then the voltage at the inverting input increases in dependence on the values of the oscillating circuit 11, 12 and 15 until such time as it reaches the same value as the reference voltage at the direct input of operational amplifier 10. At this moment the voltage at the output of operational amplifier 10 switches abruptly from a positive to a negative voltage. A reversal is set up in the oscillating circuit including inductance 11 and capacitors 12 and 15 which lasts until the voltage at the inverting input is again equal to that at the direct input. At this point the output of operational amplifier 10 again switches abruptly to a positive potential and the whole process repeats.

The main frequency determining elements in the circuit are the inductance 11 and capacitors 12 and 15. However, the frequency can also be adjusted by means of resistor 13. Resistors 17, 18 and 19' determine at which point operational amplifier 10 will switch, which of course also has an effect on the output frequency.

Any other suitable comparator may be used instead of an operational amplifier without falling outside of the scope of the present invention.

The particularly simple circuit of the present invention requires only very little room. It can therefore be placed directly where the measurement is to take place and, when the inductance is a variable inductance can be used over coupling C to furnish a frequency which is proportional to the distance d of a moving object or body B from a reference position. A frequency signifying the position of the object can therefore be generated right at the place where the measurement is being carried out and can then be furnished through connecting wires to a central evaluation circuit.

In a preferred embodiment resistors 19 and 20 are also variable resistances so that the slope of the characteristic curve of frequency vs. distance can be changed over a wide range without interfering with the oscillatory capabilities of the circuit. Increasing values of resistance 19 cause the characteristic curve to become steeper while decreasing values of resistance 20 cause the slope to decrease. This ability to change the characteristic curve has the advantage that the same frequency range can be achieved with different inductance ranges. In a simple embodiment, resistances 19 and 20 may be omitted entirely.

Mathematically, the characteristic curve of output frequency vs. inductance has a slope of $m = \Delta f / \Delta L$. The respective values of the resistors 19, 20 determine that slope.

Various changes and modifications may be made within the scope of the inventive concepts.

I claim:

1. A frequency generator having electrical power supply terminals (14, R), one of which (R) forms a reference terminal;

comparator means having a first (+) and a second (−) input and an output (16), said frequency generator further having means (17, 18) for applying a reference voltage to said first input of said comparator means, whereby said first input will form a reference input and said second input a comparison input;

the improvement comprising
a parallel tank circuit including an inductance (11) and a first capacitor (12) connected to said second input (−) and said output (16) of said comparator means in an output-to-comparison input feedback circuit;

in combination with
a second capacitor (15) connected between the second input and hence said parallel circuit and the reference terminal (R).

2. A frequency generator as set forth in claim 1, wherein said comparator means has a direct and an inverting input respectively constituting said first or reference and second or comparison input;
wherein said parallel circuit (11, 12) is connected between said output terminal (16) and said inverting input of said comparator means (10).

3. A frequency generator as set forth in claim 2, wherein said comparator means comprises an operational amplifier.

4. A frequency generator as set forth in claim 1, further comprising at least one resistor (13, 18, 19) connected to a selected one of said first and second power supply terminals (14, R).

5. A frequency generator as set forth in claim 1, wherein said inductance is a variable inductance.

6. A frequency generator as set forth in claim 5, wherein said variable inductance has an inductance varying element;
further comprising means (C) for coupling said inductance varying element to a moving object (B) so that the inductance of said variable inductance varies as a function of the position of said object relative to a reference position.

7. A frequency generator as set forth in claim 6, wherein the characteristic curve of output frequency vs. inductance has a slope $m = \Delta f/\Delta L$;
further comprising at least one resistor (19, 20) connected to said parallel circuit for determining said slope.

8. A frequency generator as set forth in claim 7, wherein said at least one resistor (19) is connected in series with said first capacitor (12).

9. A frequency generator as set forth in claim 7, wherein said at least one resistor (20) is connected in parallel to said parallel circuit.

* * * * *